United States Patent [19]
Masuda et al.

[11] Patent Number: 5,970,073
[45] Date of Patent: Oct. 19, 1999

[54] TEST PATTERN GENERATOR CIRCUIT FOR IC TESTING EQUIPMENT

[75] Inventors: Noriyuki Masuda, Oomiya; Shinichi Hashimoto, Ageo, both of Japan

[73] Assignee: Advantest Corporation, Tokyo, Japan

[21] Appl. No.: 09/080,451

[22] Filed: May 18, 1998

[30] Foreign Application Priority Data

May 29, 1997 [JP] Japan ..................... 9-140635

[51] Int. Cl.⁶ .................................. G01R 31/28
[52] U.S. Cl. ......................... 371/27.1; 371/27.5
[58] Field of Search ................. 371/27.1, 22.3, 371/22.5, 27.5; 395/183.06

[56] References Cited

U.S. PATENT DOCUMENTS

| | | | |
|---|---|---|---|
| 4,710,933 | 12/1987 | Powell et al. | 371/25.1 |
| 4,989,209 | 1/1991 | Littlebury et al. | 371/22.1 |
| 5,497,377 | 3/1996 | Muto et al. | 371/27.1 X |
| 5,606,568 | 2/1997 | Sudweeks | 371/27.1 |

*Primary Examiner*—Hoa T. Nguyen
*Attorney, Agent, or Firm*—Gallagher & Lathrop; David N. Lathrop

[57] ABSTRACT

Pattern data comprising N=8 words, where one word comprises m=3 bits, delivered in parallel from a pattern memory 2 is input to a parallel/serial conversion circuit 3. The circuit 3 can be switched between a serial output mode (MC="0") in which data for one word per pin is serially delivered every test cycle and a parallel-serial output mode in which parallel data for n–2 words per pin (m×n bits) are serially delivered every test cycle in response to a mode control signal MC.

8 Claims, 5 Drawing Sheets

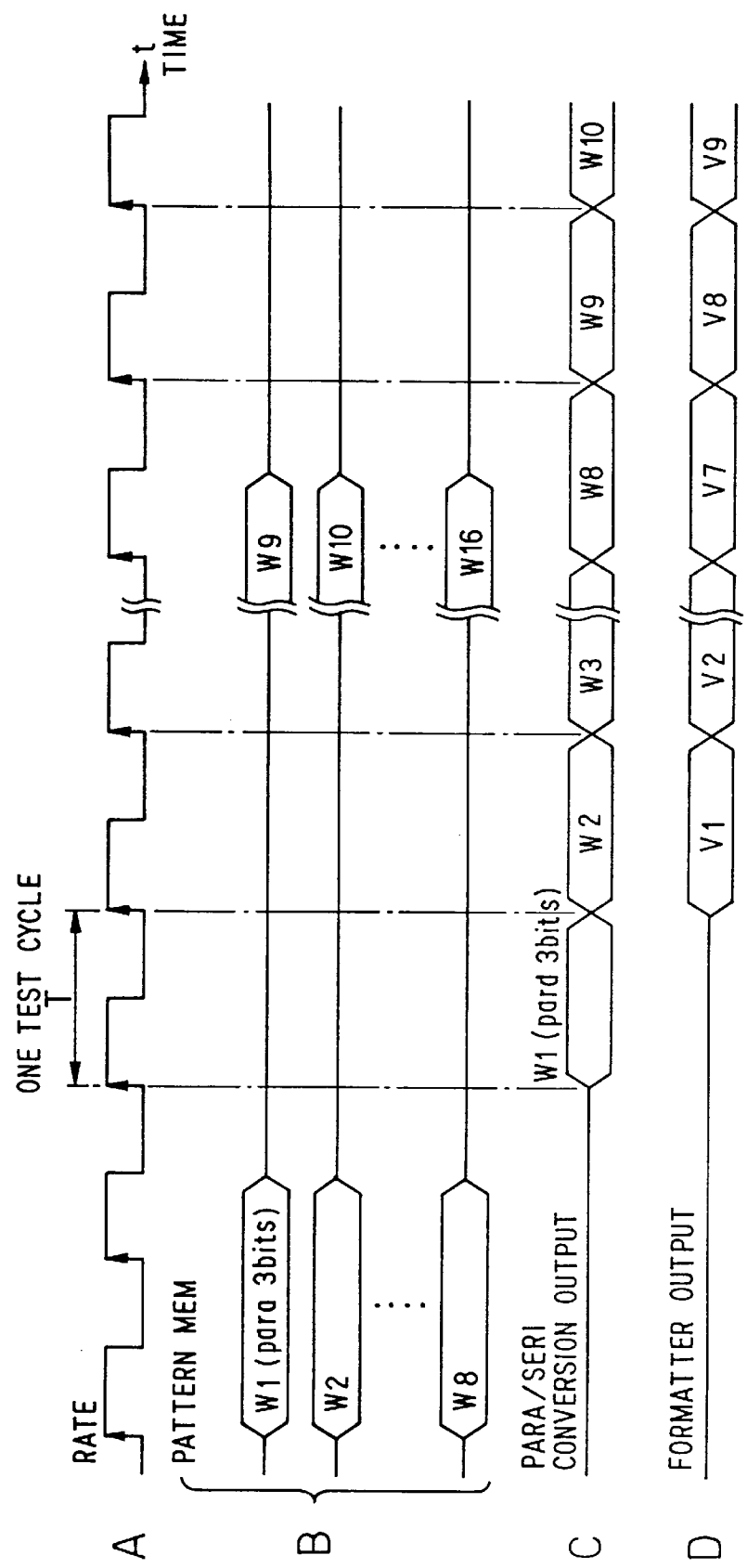

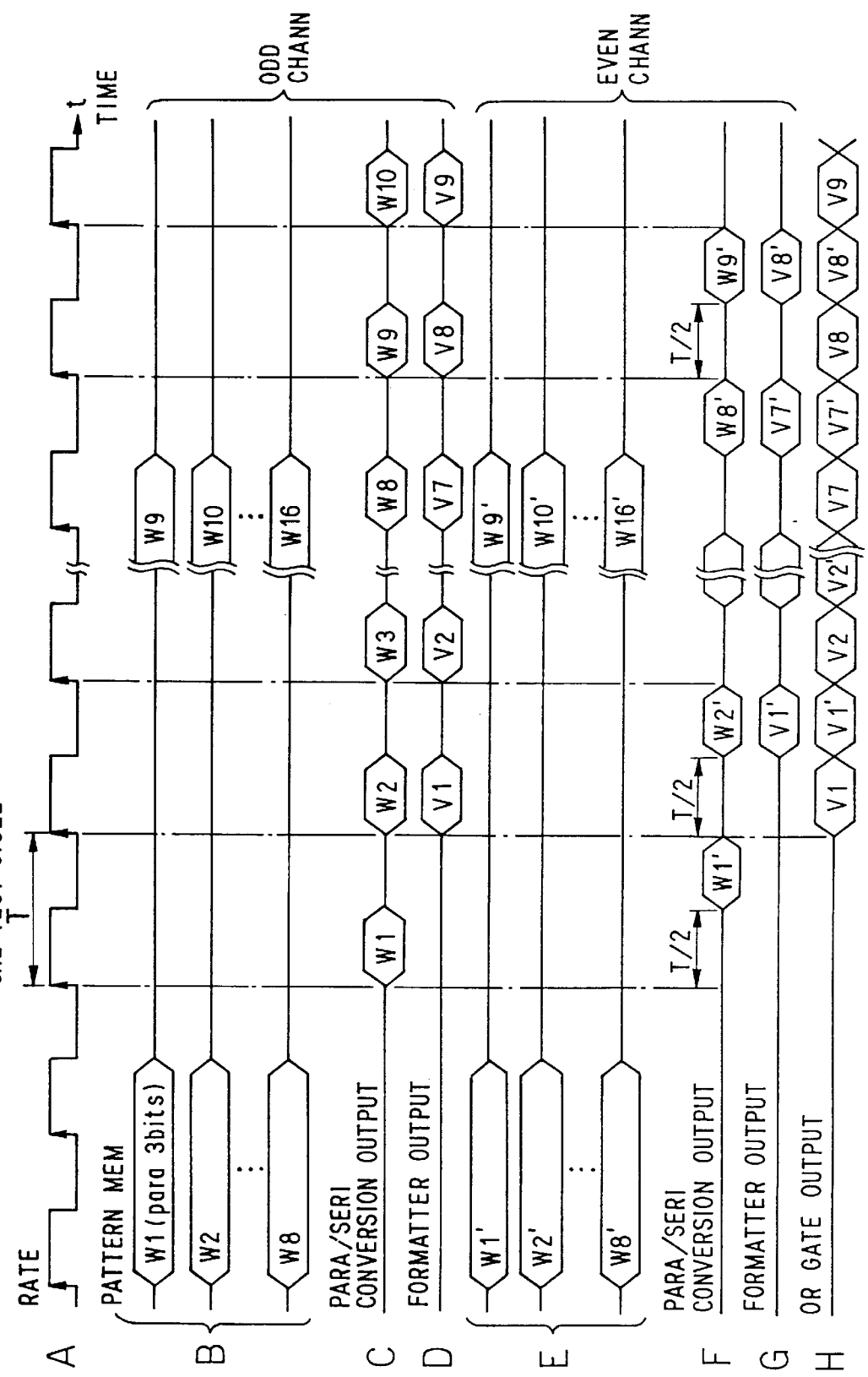

TEST PATTERN GENERATOR CIRCUIT FOR IC TESTING EQUIPMENT

BACKGROUND OF THE INVENTION

The invention relates to a test pattern generator circuit for IC testing equipment.

A testing equipment for a semiconductor integrated circuit (hereafter simply referred to as IC) includes a test pattern generator which generates a test pattern and an expected value pattern, applies the test pattern to an IC, which is a device under test (DUT), the response of which is compared against the expected value pattern to determine if if they are equal, and a result of such determination is saved in a memory. In a conventional test pattern generator circuit, the number of bits generated for the test pattern per tester channel remains constant. Accordingly, if it is desired to generate a variety of waveforms and corresponding expected value patterns or to achieve a test at a high rate, there has been a need to use a "pin multiplex" or to increase the number of bits per tester channel.

The term "pin multiplex" refers to the function of connecting two tester channel data to one pin of a device under test (DUT) in order to generate a more complicated test waveform or to perform a test at a high rate. FIG. 3 shows an odd-numbered and an even-numbered channel testing circuit CH(2$i$+1), CH(2$i$+2) which are adjacent to each other among a plurality of channel testing circuits. As shown, an odd-numbered channel testing circuit CH(2$i$+1) and an even-numbered channel testing circuit CH(2$i$+2), which are adjacent to each other, are normally used in combination. Each channel testing circuit CH includes a pattern memory 2 which stores test patterns and expected value patterns. The pattern memory 2 in each channel stores data for one mega-words where one word comprises three bits, for example.

In a normal mode which does not implement "pin multiplex", a mode signal MUX is set to "0" to disable an AND gate 13 and to cause a selector 14 to select an input to its B terminal to be delivered to its output. As shown at row B in FIG. 4, the pattern memory 2 of a respective channel delivers eight word data W1–W8 or a total of twenty-four bits in parallel, which are then converted in a parallel/serial conversion circuit 3 into a stream of parallel-by-bit and serial-by-word data W1–W8, as illustrated at row C in FIG. 4, for input to a formatter 4. The combination of the pattern memory 2 and the parallel/serial conversion circuit 3 forms a test pattern generator circuit 20. A rate signal RATE, as shown at row A in FIG. 4, is applied to a terminal 1 from a rate signal generator 10, and a timing generator circuit 5 generates timing data which is referenced to the timing of the rate signal and which is used in the formatter 4 to produce test waveforms V1–V8 (see row D in FIG. 4) and expected value data E1–E8 for eight cycles. The test waveform is applied, is with a delay of one test cycle, to one of input/output pins, Pm, of DUT 9 through an OR gate 6, a driver 7 and an input/output terminal 8 while the expected value data is applied to a digital compare circuit 11.

A response waveform which is delivered from the DUT 9 to the input/output pin Pm is input through the input/output terminal 8 to a comparator 15 where it is compared against a reference level to determine its digital value, which is then fed to the digital compare circuit 11 to be compared against the expected value data from the formatter 4. If the occurrence of a disagreement (fail) is found, it is recorded in a fail data memory 12.

During the pin multiplex mode, the mode signal MUX is set to "1", whereby the AND gate 13 is disabled and the selector 14 selects an input to its A terminal or an output from the comparator 15 of an odd-numbered channel.

In the pin multiplex mode, the parallel/serial conversion circuit 3 of an odd-numbered channel testing circuit CH(2$i$+1) delivers each of serial data W1–W8 during a first half of a corresponding test cycle, as shown at row C in FIG. 5. On the other hand, the parallel/serial conversion circuit 3 of an even-numbered channel testing circuit CH(2$i$+2) delivers each of serial data W1'–W8' during a second half of a corresponding test cycle, as shown at row F in FIG. 5. Outputs W1–W8 and W1'–W8' from the parallel/serial conversion circuits 3 of the respective channels are input to respective formatters 4 where test waveforms V1–V8 and V1'–V8' are produced on the basis of the timing data, for example, with a delay of one test cycle, and are fed to the OR gates 6 of the odd-numbered channels to be applied to the input/output pins Pm through the drivers.

It is to be noted that in the pin multiplex mode, the input/output terminals 8' of the even-numbered channels are not connected to any input/output pin of DUT 9.

The connection of a hardware for two channels with a single pin on the DUT in this manner enables a complicated test waveform to be produced. Also, the application of an odd-numbered channel test waveform during a first half of one test period and of an even-numbered channel test waveform during a second half of the test period, both to a common pin Pm, enables a testing operation to be performed at a frequency higher than the fundamental tester frequency or a higher rate test.

An alternative approach to the pin multiplex operation comprises increasing the number of bits per word generated by the test pattern generator circuit, from normal three bits to four or five bits per word.

It is recognized that the pin multiplex technique which has been employed heretofore in order to achieve a variety of test waveforms/expected values or a higher rate test exhibits a disadvantage that the number of effective channels of the tester is reduced because two channels of the tester resource are used for one pin of DUT. It may be inappropriate depending on the number of pins on a device and the channel arrangement of the tester.

In addition, the conventional approach of increasing the number of bits for one word/pin which defines the test waveform for one test cycle from the test pattern generator circuit requires an increased memory capacity, causing a cost increase of the tester. Furthermore, where the generation of simple waveforms expected values or a low rate of operation is sufficient for purpose of the test, which is applicable in most instances, the increase in the number of bits is nothing more than the redundancy, wastefully increasing the demand on the user.

SUMMARY OF THE INVENTION

It is an object of the invention to provide a test pattern generator circuit capable of efficiently utilizing the channel resource without reducing the number of effective channels of the tester.

In accordance with the invention, in a test pattern generator circuit for IC testing equipment comprising a pattern memory and a parallel/serial conversion circuit which receives pattern data for N words, where N represents an integer greater than one and each word comprises a plurality of m bits, delivered in parallel from the pattern memory and delivers such data in serial form, an arrangement is made such that the parallel/serial conversion circuit can be switched between a serial output mode in which data for one word per pin is delivered serially for every test cycle and a parallel-serial output mode in which parallel data (m×n bits) for plural words (n words) per pin are delivered serially for every test cycle in response to a mode control signal.

In accordance with the invention, the pattern memory stores data for N words per address where N represents an even number, and the parallel/serial conversion circuit includes a cache memory for successively storing parallel data for N words per address which are successively transferred from the pattern memory in a memory region for N words per address, deploying means for deploying the parallel data for N words delivered from the cache memory into a form of parallel data for N/2 words in each of two consecutive cycles, parallel/serial conversion means operative in the serial output mode to receive parallel data for N/2 words delivered from the deploying means every period of N·T/2 where T represents one test period and to deliver one word every period T in serial form, and parallel/parallel-serial conversion means operative in the parallel-serial output mode to receive parallel data for N/2 words delivered from the deploying means every period of N·T/4 and to convert it into a form of parallel data for N·T/4 words in each of two consecutive cycles.

According to the invention, the pattern memory comprises a synchronous dynamic RAM (SDRAM), and the cache memory comprises a pair of interleaved static RAM's.

In one embodiment of the present invention, one word comprises three bits.

In one embodiment of the present invention, the deploying means comprises a first and a second buffer register each storing data for N/2 words from the N words per address of the cache memory, and a selector for alternately selecting the data for N/2 words delivered in parallel form from the first and the second buffer register.

In one embodiment of the present invention, the parallel/serial conversion means comprises a buffer register for storing parallel data for N/2 words delivered from the deploying means, and a selector for selecting the data in the buffer register word by word for delivery.

In one embodiment of the present invention, the number of words N per address of the pattern memory and the cache memory is chosen equal to eight.

In one embodiment of the present invention, the parallel/parallel-serial conversion means comprises a buffer memory for storing parallel data for four words delivered from the deploying means, a selector for selecting a first and a third word during a first and a second test cycle from the parallel data for a first to a fourth word which occur every period of 2T in the buffer register, and a selector for selecting a second and a fourth word during the first and the second test cycle.

BRIEF DESCRIPTION OF THE DRAWINGS

FIG. 4 is a series of timing charts for the testing circuit shown in FIG. 3 when it operates in the normal, low rate mode without the pin multiplex operation; and FIG. 5 is a series of timing charts for the testing circuit shown in FIG. 3 when it operates in the pin multiplex mode.

DETAILED DESCRIPTION OF THE PREFERRED EMBODIMENT

Figure 2:
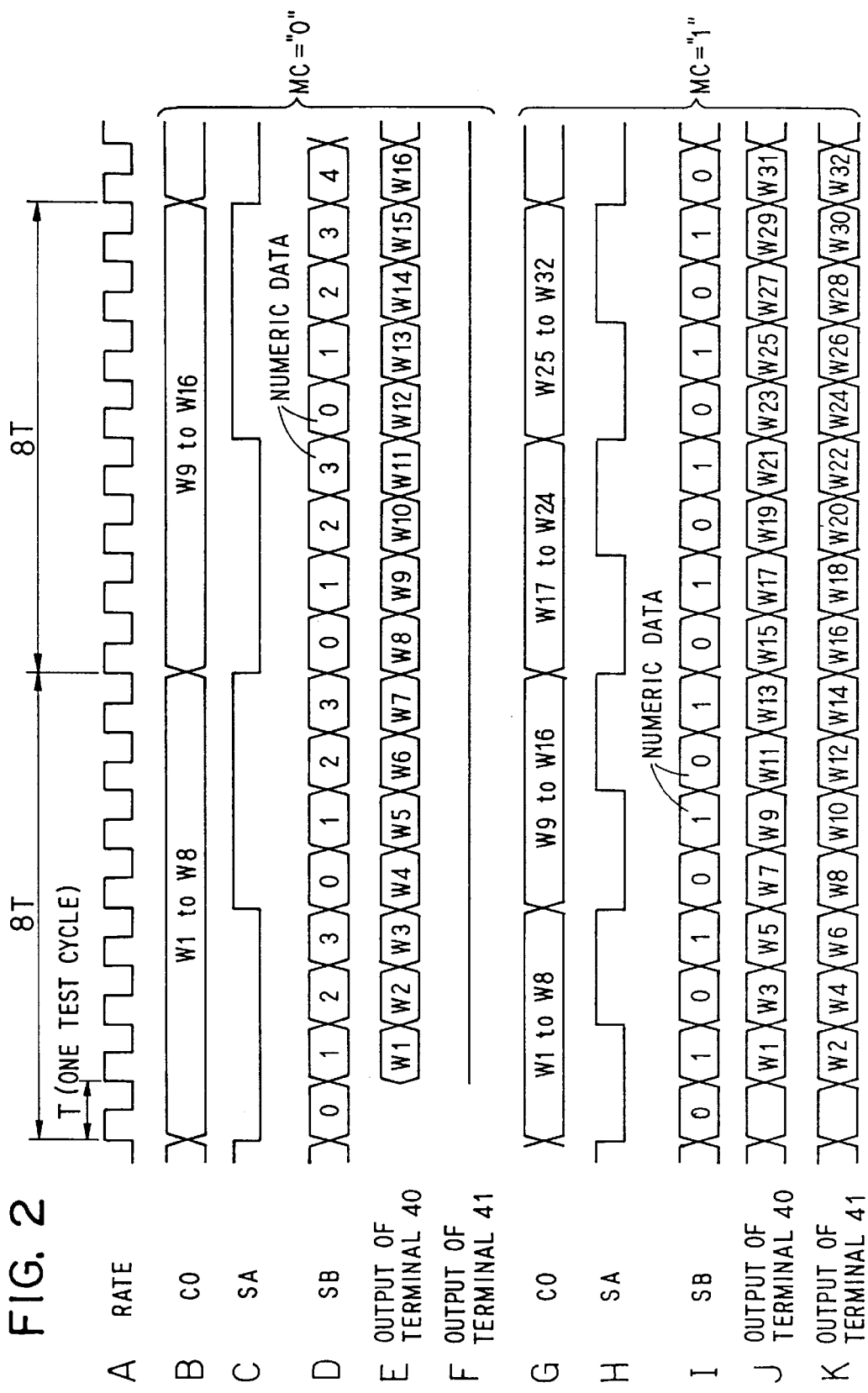
FIG. 2 is a series of timing charts for the circuit arrangement of FIG. 1.
Figure 3:
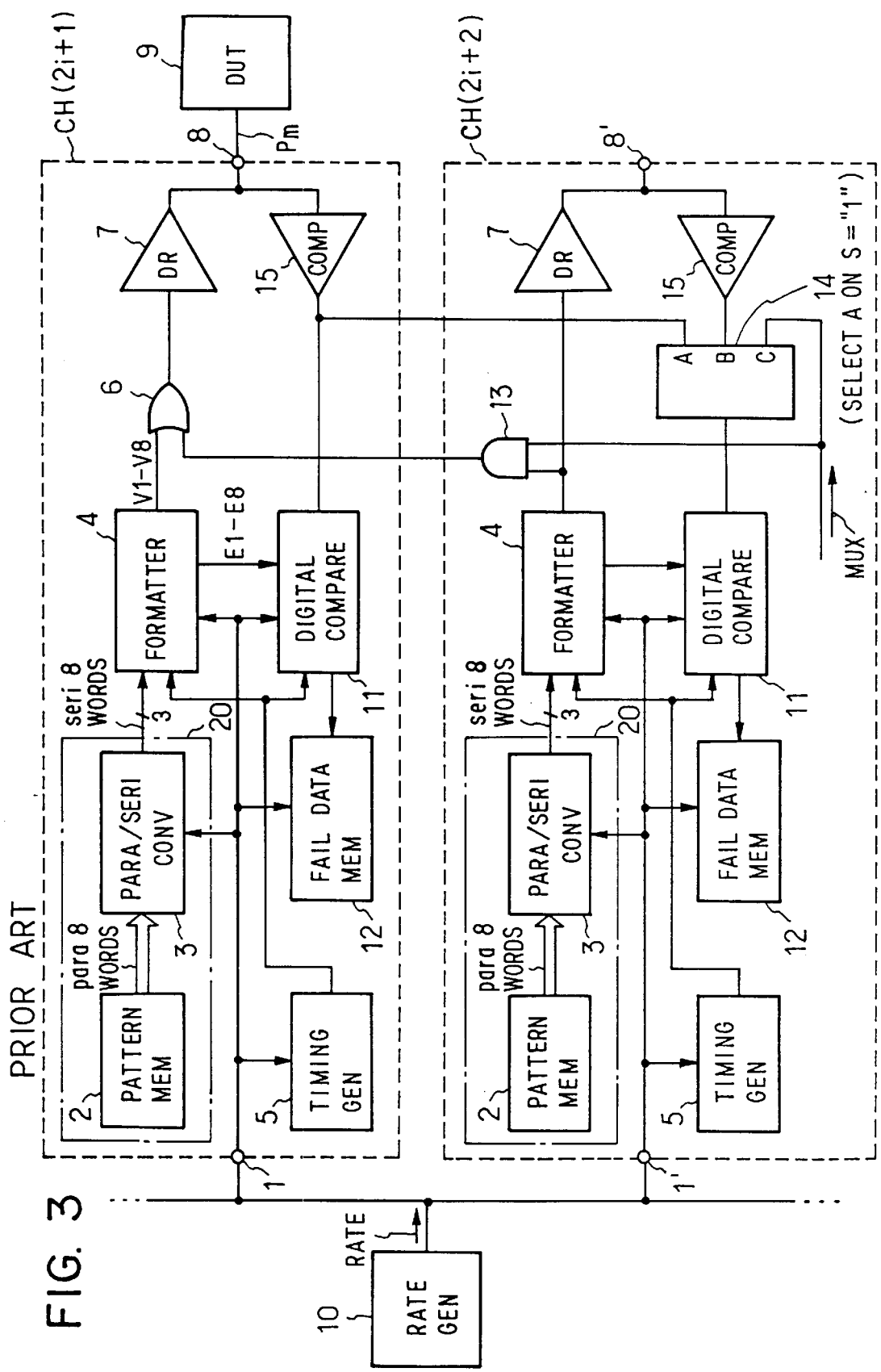
FIG. 3 is a block diagram of a conventional testing circuit which can be switched to a pin multiplex mode.

A test pattern generator circuit according to one embodiment of the invention will now be described with reference to FIGS. 1 and 2. The basic arrangement of each tester channel is similar to the arrangement for the channel CH(2i+1) shown in FIG. 3 except that the OR gate 6 is removed so that the outputs V1–V8 from the formatter 4 are always applied to the driver 7. However, the arrangement of the parallel/serial conversion circuit 3 differs from that illustrated in FIG. 3. In addition, any one of all the tester channels can be used with the input/output terminal pin of the DUT 9. Accordingly, a test pattern generator circuit 20 for only one channel is shown in FIG. 1, and the remainder will be described with reference to FIG. 3.

Figure 1:
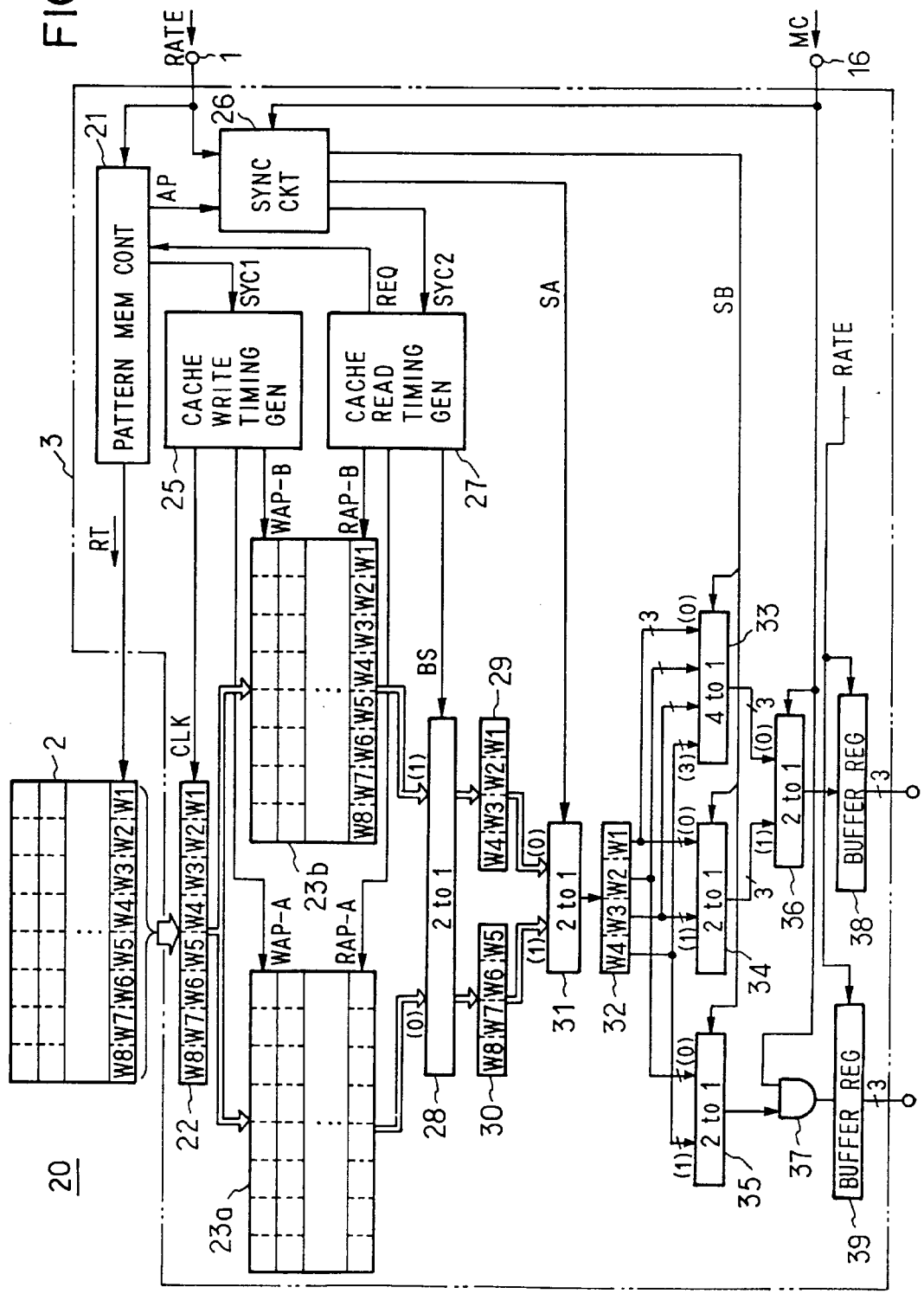
FIG. 1 is a block diagram of a test pattern generator circuit according to one embodiment of the invention, illustrating a circuit section for one channel.

The test pattern generator circuit 20 according to the invention comprises a pattern memory 2 and a parallel/serial conversion circuit 3 as illustrated in FIG. 1, for each tester channel. In the present example, the pattern memory 2 comprises a synchronous dynamic RAM (SDRAM), which includes a clock synchronized interface. The SDRAM has its memory cell formed by one transistor and one capacitor, and requires a refresh pulse at a given time interval in order to maintain the stored content. As compared with a static RAM, the SDRAM has a reduced power dissipation, is constructed to a higher integration level, inexpensive, but is slow in its operational speed. Because eight words (3×8=24 bits) are read out in parallel from the SDRAM, the low rate of operation presents no problem whatsoever in the test pattern generator circuit.

A pattern memory control circuit 21 of each test channel delivers a read timing signal RT that includes an address signal to the pattern memory 2 in synchronism with a RATE signal (having a test period T) which is input to a terminal 1. In response, the pattern memory 2 delivers parallel data for eight words (3×8=24 bits), or test pattern data for eight cycles, which are written into a buffer register 22 in parallel.

The eight word data which is written into the buffer register 22 is transferred in parallel to a cache memory 23a or 23b. SDRAM has a time interval during which data read-out is inhibited for its refresh operation, and thus a pair of cache memories 23a, 23b are used to provide an interleaved two-way arrangement. In this manner, when one of cache memories, which may be 23a, for example, assumes a write mode during a particular test cycle, data is read from the other or the memory 23b. These modes are reversed during the next test cycle, and thus data is written into the cache memory 23b while data may be read out from the memory 23a. In this manner, data which is once written into can be read out without interruption.

A sync signal SYC1 which is used to achieve a synchronization between a read-out from the pattern memory 2 and a write operation into the cache memories 23a, 23b is applied from the pattern memory control circuit 21 to a cache write timing generator 25, which then feeds to the buffer register 22 a clock CLK which is used to accept parallel data for eight words (24 bits) per address from the pattern memory 2, and which also feeds a write address pointer signal WAP-A or WAP-B alternately to the cache memory 23a or 23b.

An address pointer signal AP similar to an address pointer signal contained in the read timing signal RT applied to the pattern memory 2 is fed from the pattern memory control circuit 21 to a synchronization circuit 26. A sync signal SYN2 is applied from the circuit 26 to a cache read timing generator 27 in order to achieve a synchronization between the read-out from either cache memory 23a or 23b and the address pointer signal AP and the RATE signal. As a consequence of this, the circuit 27 feeds read address pointer signals RAP-A and RAP-B which are synchronized with the address pointer signal AP and the RATE signal to the cache memories 23a and 23b alternately. Each of the cache memories 23a and 23b has a number of addresses longitudinally as viewed in FIG. 1 or in a direction of depth of the memory 2 which may correspond to sixty-four rows, for example, each row being capable of storing data corresponding to eight words (3×8=24 bits).

The cache read timing generator 27 applies a bank select signal BS to a selector 28, which then responds by selecting either output from the cache memory 23a or 23b. The parallel data corresponding to eight words which are read out from either cache memory 23a or 23b is simultaneously fed from the selector 28 to a pair of buffer register 29 and 30, into which four words are each written in parallel.

(1) Serial output mode (MC="0")

In the serial output mode, the parallel/serial conversion circuit 3 of each channel serially delivers test pattern data, by delivering one word (three bits in parallel) every test cycle (1×T). At this time, a mode control signal MC applied to a terminal 16 from the exterior is chosen to be logical "0". Cache outputs CO which are fed from the cache memory 23a to the first and the second buffer register 29 and 30 through the selector 28 represent parallel lo data corresponding to words W1–W8 (or a total of 24 bits) in a time interval of 8T, and will be parallel data for words W9–W16 in a time interval of following 8T (see row B in FIG. 2). The synchronization circuit 26 feeds a select signal SA to a selector 31, the select signal SA assuming a low (L) level during the first half of the time interval of 8T and assuming a high (1 level during the second half of time interval of 4T (see row C in FIG. 2). The selector 31 selects parallel data corresponding to four words from either buffer register 29 or 30, and feeds it to a buffer register 32 in parallel.

The four words (3×4=12 bits) in the buffer register 32 may be denoted as words W1–W4, for example. In this instance, three bit data for each of W1, W2, W3 and W4 is fed to input terminals No. 0, No. 1. No. 2 and No. 3 of a selector 33, respectively, it being understood that each numbered input terminal actually contains three terminals corresponding to the three bits. Data for words W1 and W3 is fed into the input terminals No. 0 and No. 1 (each containing three terminals) of a selector 34, and data for words W2 and W4 is fed to input terminals No. 0 and No. 1 (each containing three terminals) of a selector 35.

The synchronization circuit 26 also delivers a select signal SB representing a numerical value which is incremented by one in a manner of 0, 1, 2, 3 during a time interval (4T) during which the select signal SA assumes the L level. The numerical value represented by the select signal SB is similarly incremented in the manner of 0, 1, 2, 3 during the interval (4T) during which the next select signal SA assumes the H level, subsequently repeating a similar change in the numerical value (see row D in FIG. 2). As the numerical value of the select signal SB changes in the manner of 0, 1, 2 and 3, data W1, W2, W3 and W4 which are applied from the selector 33 to the input terminals No. 0 to No. 3 are sequentially selected to be input to a buffer resistor 38 through a selector 36 (since MC="0", the input terminal No. 0 (three bits) is selected). The data in the buffer register 38 is delivered to an output terminal 40 in synchronism with the rising edge of the next following RATE signal.

During the time interval of 4T after the select signal SA is switched to its H level, data W5–W8 which is written into the buffer register 30 is selected by the selector 31 and transferred to the buffer register 32 to be sequentially selected by the selector 33 as the numerical value indicated by the select signal SB changes in the manner of 0, 1, 2 and 3 so as to be input to the buffer register 38 through the selector 36. The data in the buffer register 38 is delivered to the output terminal 40 at the next timing. A similar operation as described above is then repeated.

During a time interval when the mode control signal MC="0", the output from the selector 34 is not selected by the selector 36. Since an AND gate 37 is disabled, the output from the selector 35 cannot pass therethrough. Accordingly, an output at an output terminal 41 assumes an L level (see row F in FIG. 2).

When a read-out operation from either cache memory 23a or 23b is completed, the cache read timing generator 27 applies a request signal REQ to the pattern memory control circuit 21 since it is necessary to perform a next read-out operation from the pattern memory 2.

(2) Parallel-serial output mode (MC="1")

In this instance, the parallel/serial conversion circuit 3 of each channel delivers test pattern data in a serial form such that parallel data for two words is delivered every test cycle (1×T). The mode control signal MC is set to logical "1". Data which is delivered from the cache memory 23a through the selector 28 to the buffer register 29 and 30 during the time interval of 4T will be W1–W8, W9–W16, W17–W24, W25–W32 . . . (see row G in FIG. 2). The select signal SA changes in a manner from L→H→L . . . every time interval of 2T (see row H in FIG. 2), and in response to the change from L to H of the select signal SA, the four word data in one of the buffer register 29/30 are selected by the selector 31 to be input to the buffer register 32.

During the time interval of 2T when the select signal SA assumes either L or H level, the numerical data represented by the select signal SB assumes "0" during the initial 1T interval, but changes to "1" during the later 1T interval (see row I in FIG. 2). During the initial interval when SB="0", data W1 in the buffer register 32 is selected by the selector 34 to be input to the buffer register 38 through the selector 36 (where the input terminal No. 1 is selected because of MC="1"), and the data W2 in the buffer register 32 is selected by the selector 35 to be input to a buffer register 39 through the AND gate 37. At the next timing, data W1 and W2 are simultaneously delivered to the output terminals 40 and 41 (see rows J, K in FIG. 2).

During the later interval when SA="1", data W3 and W4 in the buffer register 32 are selected by the selectors 34 and 35, respectively, to be input to the buffer register 38 and 39 in a manner similar to that mentioned previously, and are then delivered to the output terminals 40 and 41 at the next timing (see rows J, K in FIG. 2). Subsequently, data (W5, W6); (W7, W8); (W9, W10); . . . is delivered to the output terminals 40 and 41 every 1T interval.

In the above description, the memory capacity per address of the pattern memory 2 and the cache memories 23a, 23b has been assumed as N=8 words, with one word being formed by three bits. However, it is unnecessary that invention be so limited, but the memory capacity may be chosen otherwise such as N=16, 32 words or the like. In addition, the number of bits in one word may be four or five bits, and can be described as being m bits in general.

It has been described that during the serial output mode, pattern data comprises three bits per pin while during the parallel-serial output mode, pattern data has been described as 3×2=6 bits per pin. However, it should be obvious that the invention can be expanded to m bits per pin during the serial output mode and to m×n bits per pin (where n is an integer greater than one), namely, to the serial delivery of parallel data for n words during the parallel-serial output mode.

EFFECTS OF THE INVENTION (1) According to the invention, a mode control signal MC which is applied to the parallel/serial conversion circuit 3 of the test pattern generator circuit of each channel is employed so that when MC="0", for example, the circuit 3 successively delivers one word W1, W2, W3 . . . every test cycle (1×T) from the data stored in the pattern memory 2 while when MC="1", the circuit 3 serially delivers n word (for example, n may be equal to two) parallel data every test cycle (1×T), for example, in the sequence of (W1, W2); (W3, W4); (W5, W6) . . . Accordingly, a problem experienced with the conventional pin multiplex approach that the number of effective channels of the tester is reduced because two channels of the tester channel resource are used with respect to one pin on the DUT is avoided.

(2) According to the invention, for a low rate test, MC="0" may be used to deliver sequentially a single word (which may comprise three bits, for example) every tester cycle. Accordingly, a problem that an increase in the number of bits represents a redundancy to cause a wasteful demand on the user as experienced in a conventional pattern generator circuit in which the number of bits in one word is increased in order to generate a variety of test waveforms or to achieve a higher rate test is also avoided.

What is claimed is:

1. A test pattern generator circuit for each testing channel of an IC testing equipment in which a test pattern is applied to an IC under test and a response output therefrom is compared against expected value data to detect any fault, comprising a pattern memory for delivering pattern data for N words in parallel;

and a parallel/serial conversion circuit to which N words of the pattern data which are delivered in parallel are fed from the pattern memory and which can be switched between an serial output mode in which data for one word per pin is serially delivered every test cycle and a parallel-serial output mode in which m×n bits in the parallel data for n words per pin are serially delivered every test cycle in response to a mode control signal, where one word comprises m bits and N, m and n are integers equal to or greater than two.

2. A test pattern generator circuit according to claim 1 in which N represents an even number and the pattern memory stores data for N words per address, and in which the parallel/serial conversion circuit comprises a cache memory for successively storing the parallel data for N words per address which are successively transferred from the pattern memory into a memory region for N words per address, deploying means for deploying the parallel data for N words delivered from the cache memory into a form of parallel data for N/2 words in each of two consecutive cycles, parallel/serial conversion means operative in the serial output mode to receive the parallel data for N/2 words delivered from the deploying means every period of N·T/2 where T represents one test period and to deliver it serially in the form of one word every period T, and parallel/parallel-serial conversion means operative in the parallel-serial output mode to receive the parallel data for N/2 words delivered from the deploying means every period of N·T/4 and to convert it into serial data containing N/4 words in parallel in each of two consecutive cycles.

3. A test pattern generator circuit according to claim 1 in which the pattern memory comprises a synchronous dynamic RAM (SDRAM), and the cache memory comprises a pair of interleaved static RAM's.

4. A test pattern generator circuit according to claim 1 in which one word comprises three bits.

5. A test pattern generator circuit according to claim 2 in which the deploying means comprises a first and a second buffer register each storing N/2 words from the data containing N words per address from the cache memory, and a selector for alternately selecting N/2 word data which is each delivered in parallel form from the first and the second buffer register.

6. A test pattern generator circuit according to claim 2 in which the parallel/serial conversion means comprises a buffer register for storing the parallel data for N/2 words delivered from the deploying means, and a selector for selecting the data from the buffer register word by word for delivery.

7. A test pattern generator circuit according to claim 2 in which the number of words N per address of the pattern memory and the cache memory is equal to eight.

8. A test pattern generator circuit according to claim 7 in which the parallel/parallel-serial conversion means comprises a buffer register for storing the parallel data for four words delivered from the deploying means, a first selector for selecting a first and a third word during a first and a second test cycle, respectively, from a first to a fourth word in the parallel data contained in the buffer register in a time interval of 2T, and a second selector for selecting a second and a fourth word during the first and the second test cycle, respectively.

* * * * *